United States Patent
Lin

(10) Patent No.: US 8,295,510 B2
(45) Date of Patent: Oct. 23, 2012

(54) POWER-SAVING AMPLIFYING DEVICE

(75) Inventor: Chi-Lien Lin, Luzhu Township, Taoyuan County (TW)

(73) Assignee: Sound Cheers Limited, Luzhu Township, Taoyuan County (TW)

( * ) Notice: Subject to any disclaimer, the term of this patent is extended or adjusted under 35 U.S.C. 154(b) by 402 days.

(21) Appl. No.: 12/725,084

(22) Filed: Mar. 16, 2010

(65) Prior Publication Data

US 2011/0228952 A1    Sep. 22, 2011

(51) Int. Cl.
*H03G 3/00* (2006.01)
*H04R 3/00* (2006.01)
*H03F 3/38* (2006.01)

(52) U.S. Cl. ........ 381/105; 381/107; 381/109; 381/117; 381/120; 330/10; 330/207 A; 330/297

(58) Field of Classification Search .................. 381/55, 381/102, 104, 105, 107, 109, 111, 116–118, 381/120; 330/10, 251, 207 A, 199, 259, 330/297, 298
See application file for complete search history.

(56) References Cited

U.S. PATENT DOCUMENTS

| | | | | |
|---|---|---|---|---|
| 5,802,187 A | * | 9/1998 | Hsu | 381/119 |
| 5,898,340 A | * | 4/1999 | Chatterjee et al. | 330/251 |
| 6,240,191 B1 | * | 5/2001 | Yoon | 381/109 |
| 7,170,339 B2 | * | 1/2007 | Saito et al. | 330/10 |
| 7,532,543 B2 | * | 5/2009 | Yanai | 367/137 |
| 7,822,214 B1 | * | 10/2010 | Melanson | 381/100 |
| 2009/0220110 A1 | * | 9/2009 | Bazarjani et al. | 381/120 |

* cited by examiner

*Primary Examiner* — Xu Mei
(74) *Attorney, Agent, or Firm* — Muncy, Geissler, Olds & Lowe, PLLC

(57) ABSTRACT

An power-saving amplifying device is disclosed, the power-saving amplifying device uses a micro controller unit (MCU) to receive a control signal transmitted by a volume controller and to generate a decision signal based on the control signal; the MCU transmits the decision signal to the volume controlling circuit for obtaining a drive signal, then the volume controlling circuit transmits the drive signal to a power amplifier for driving a speaker to output a sound with a required volume; the MCU also calculates an output value of a PWM signal and transmits the PWM signal to a DC integrating circuit for rectifying and integrating the PWM signal into a DC voltage; the DC voltage is coupled with a voltage control terminal of the power supply to increase or decrease the DC voltage outputted by the power supply to the power amplifier, thereby reducing power consumption by using the volume to control the output voltage of the power supply.

6 Claims, 3 Drawing Sheets

POWER-SAVING AMPLIFYING DEVICE

BACKGROUND OF THE INVENTION

1. Field of the Invention

The present invention relates to a power-saving amplifying device, and more particularly, to a power-saving amplifying device which can adjust an DC voltage outputted by a power supply according to a volume to reduce the power through reducing the DC voltage and to improve power efficiency, thereby saving more than 30% of power.

2. Description of the Prior Art

In an audio system, the power amplifier and the power supply consume the most power; when no input signal is present, the power amplifier still consumes a certain amount f power, which is determined by the value of the DC voltage ($V_{CC}$), the lower the DC voltage, the less power consumed; therefore, the power consumption under the no-input-signal condition (or the wait state) can be reduced by lowering the supply voltage; for example, when the DC voltage is 34V, the power consumption of the power amplifier under the wait state is 3 W, when the DC voltage drops to 30V, the power consumption of the power amplifier under the wait state is 2 W, when the voltage drops to 20V, the power consumption of the power amplifier under the wait state is below 1 W.

The same can be applied when the power amplifier is operating, if the volume is set to be low, then the DC voltage can be reduces to lower the output power, thereby reducing the power consumption.

However, the prior art power amplifier has the following deficiencies:

1. Users usually adjust the volume within a small range (such as, within 50% of the normal volume); however, the power supply always output 100% of the power, making it less efficient for saving power.

2. Presently, various multi-channel surround audio systems and high output power amplifiers are popular; thus the power demands increase every year.

As reducing power consumption and saving the environment become a global consensus, the prior art design should be improve to meet the requirements of environmental conservation.

In view of the deficiencies of the prior art techniques, after years of constant researches, the inventor has successfully proposed a power-saving amplifying device in the present invention.

SUMMARY OF THE INVENTION

It is an object of the present invention to provide a power-saving amplifying device which adjusts the output power of a power supply according to the volume without affect the sound quality, thereby reducing power consumption and lowering carbon emission.

In order to achieve the above object, the present invention discloses a power-saving amplifying device, mainly comprises a power supply, a power amplifier, a micro controller unit, a DC integrating circuit, a volume controller, and a volume controlling circuit; when the micro controller unit (MCU) receives a control signal from the external volume controller, the MCU outputs a decision signal to the volume controlling circuit for obtaining a volume setup value, then the volume controlling circuit transmits the volume setup value and the audio signal to the power amplifier to amplify the audio signal and to drive the speaker to output a sound according to the volume setup value; meanwhile, the micro controller unit calculates an output value of a PWM signal and transmits the PWM signal to a DC integrating circuit for rectifying and integrating the PWM signal into a DC voltage; the DC voltage is then sent to the power supply; the power supply comprises the PWM controlling circuit and the power supply circuit, the power supply circuit mainly supplies the DC power to the power amplifier for amplifying the audio signal to drive the speaker; when the PWM controlling circuit receives the PWM signal from the DC integrating circuit, the PWM controlling circuit control the outputted value of the DC voltage of the power supply circuit according to the PWM signal, wherein the value of the DC voltage is proportional to the volume.

DETAILED DESCRIPTION OF THE PREFERRED EMBODIMENT

Figure 1:
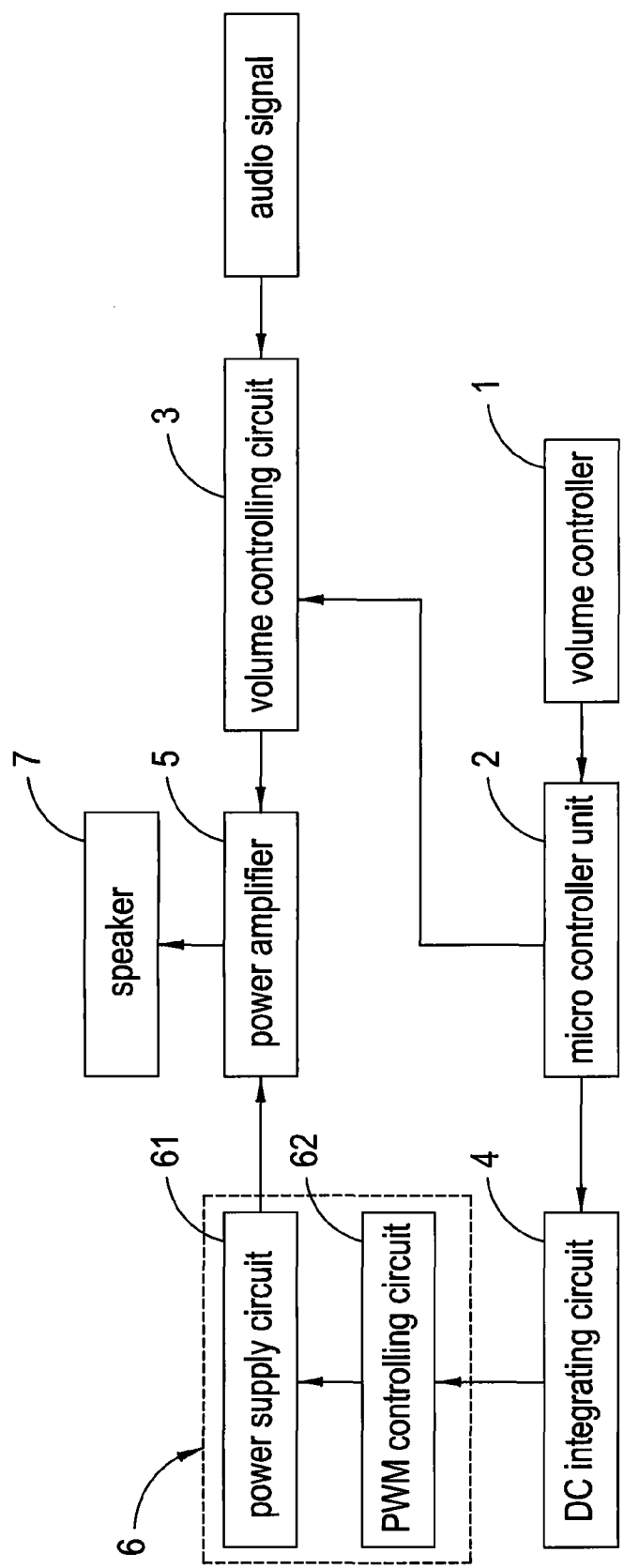
FIG. 1 illustrates a block diagram of a power-saving amplifying device in the present invention.
Figure 2A:
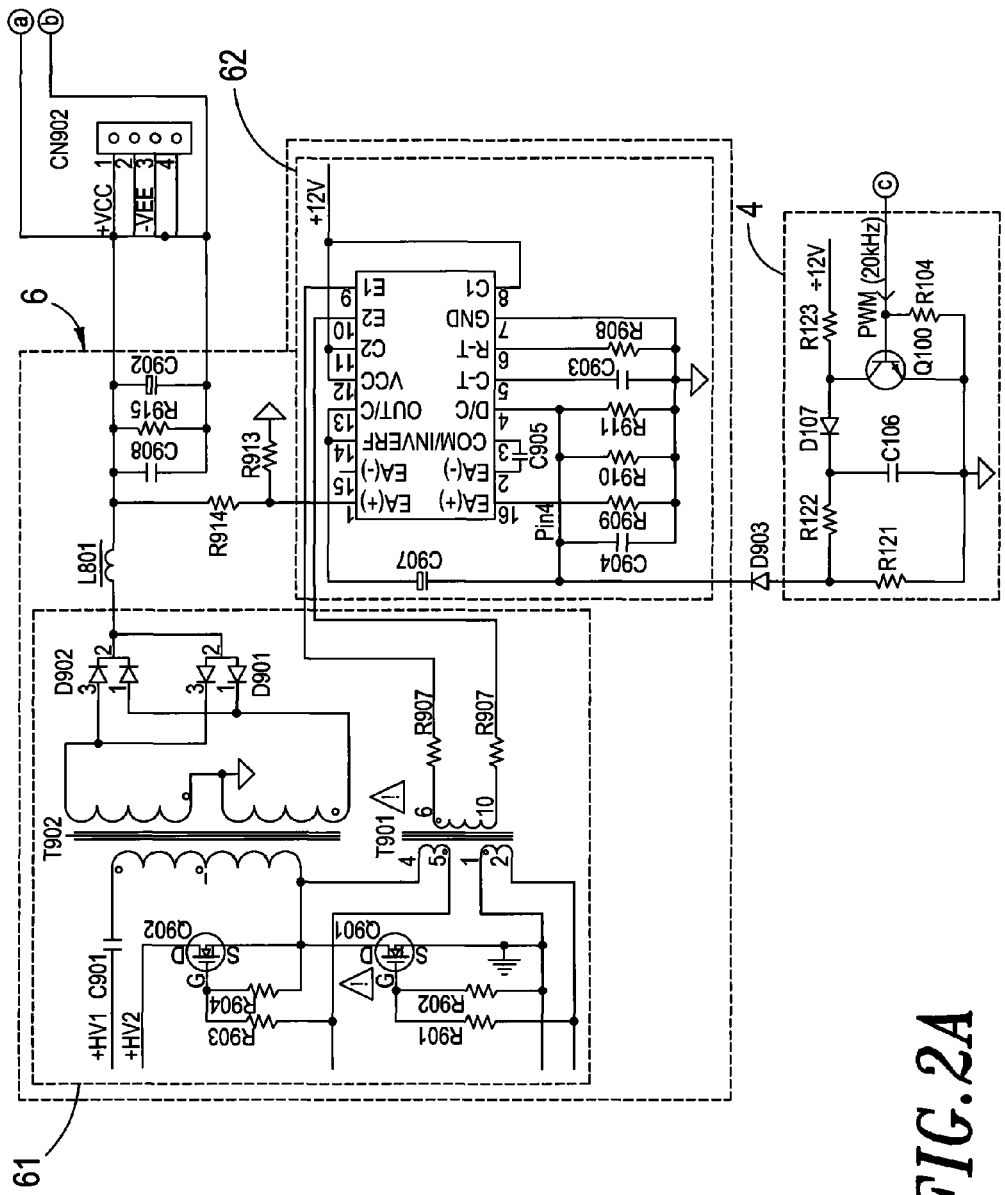
FIG. 2A and FIG. 2B illustrate a circuit diagram of the power-saving amplifying device in the present invention.
Figure 2B:
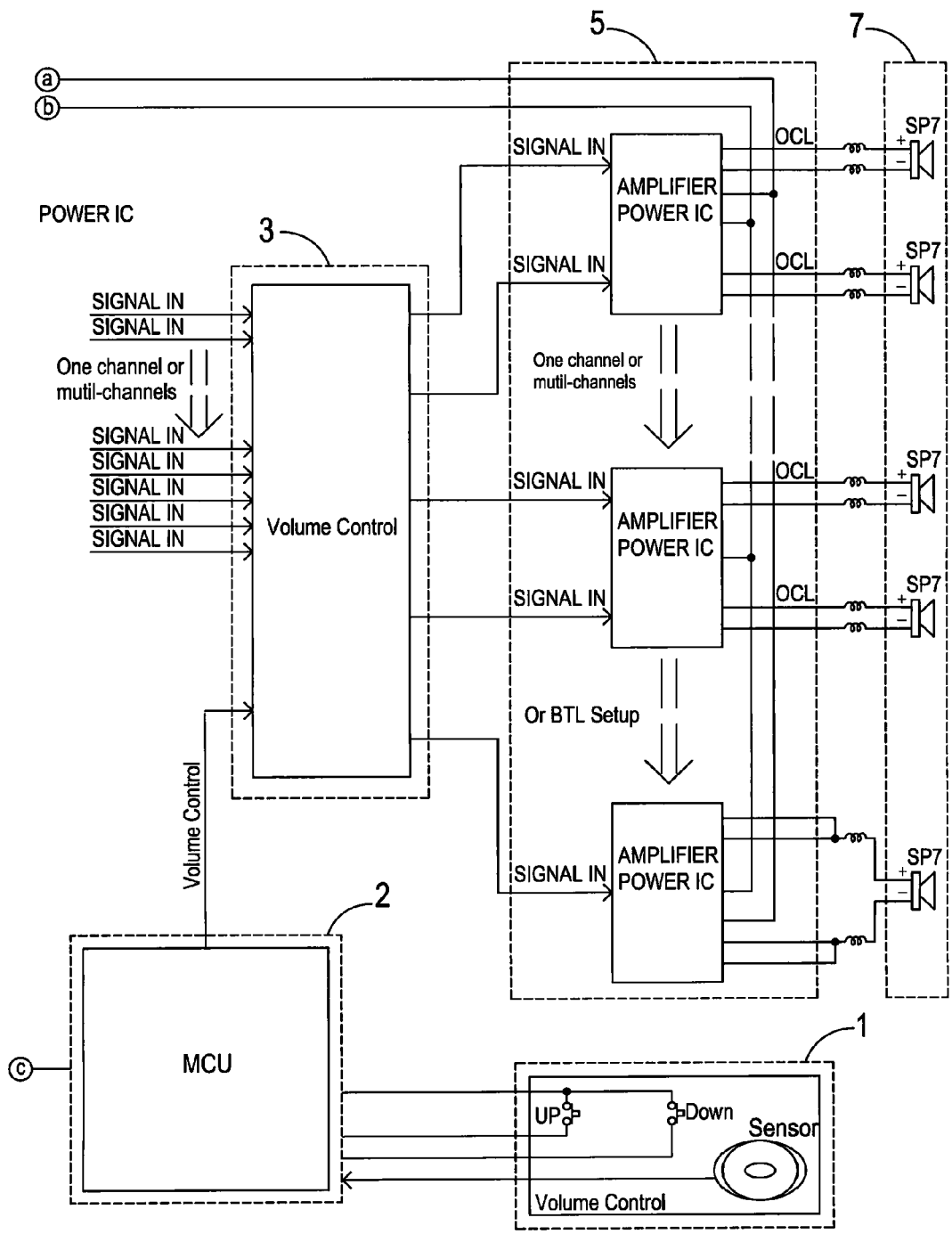

Please refer to FIG. 1, FIG. 2A and FIG. 2B for a power-saving amplifying device in the present invention, the a in FIG. 2A is connected to the a in FIG. 2B, and the b, c in FIG. 2A are connected to the b, c in FIG. 2B, which mainly comprises:

a volume controller 1 connected with micro controller unit 2 for transmitting a control signal to the micro controller unit 2 for adjusting a volume, the volume controller 1 can be a key pad or a remote control;

the micro controller unit 2 receiving the control signal from the volume controller 1 to generate a decision signal and a PWM signal 21 according to the received control signal, the micro controller unit 2 transmitting the decision signal to the volume controlling circuit 3 and the PWM signal to a DC integrating circuit 4;

the volume controlling circuit 3 receiving the decision signal from the micro controller unit and an audio signal for obtaining a volume setup value, and then transmitting the volume setup value and the audio signal to the power amplifier 5;

the DC integrating circuit 4 receiving the PWM signal 21 from the micro controller unit 2 and integrating the PWM signal 21 into an DC voltage, and then transmitting the DC voltage to a PWM controlling circuit of the power supply; wherein the value of the integrated DC voltage is determined by an pulse width of the PWM signal 21 outputted by the micro controller unit 2, and the pulse width of the PWM signal 21 is determined by the volume;

the power supply 6 comprising a power supply circuit 61 and a PWM controlling circuit 62, wherein the PWM controlling circuit 61 controls the output voltage of the power supply circuit 61; the power supply 6 using the PWM controlling circuit 61 to receive the PWM controlling circuit 61 from the DC integrating circuit 4 to transmitting a power control signal to a power amplifier to increase or decrease the output voltage of the power supply circuit 61;

the power amplifier 5 receiving the power control signal from the power supply circuit 62 and the audio signal from the volume controlling circuit 3, and then amplifying the audio signal according to the power control signal to drive a speaker 7 to output a sound, wherein the volume is controlled by the volume controller 1.

Moreover, the output power of the power amplifier 5 is determined by the output voltage of the power supply circuit 61 of the power supply 6.

The present invention discloses a power-saving amplifying device, while compared to other prior art techniques, is advantageous in:

The present invention adjusts the output power of the power supply according to the volume to improve the power efficiency of the power supply and the power amplifier to reduce power consumption.

Many changes and modifications in the above described embodiment of the invention can, of course, be carried out without departing from the scope thereof.

Accordingly, to promote the progress in science and the useful arts, the invention is disclosed and is intended to be limited only by the scope of the appended claims.

What is claimed is:

1. A power-saving amplifying device comprising:
   a volume controller for transmitting a control signal to a micro controller unit for adjusting a volume;
   the micro controller unit for receiving the control signal from the volume controller to generate a decision signal and an output value of a PWM signal according to the received control signal, the micro controller unit transmitting the decision signal to a volume controlling circuit and the PWM signal to a DC integrating circuit;
   a volume controlling circuit for receiving the decision signal from the micro controller unit and an audio signal for obtaining the volume setup value, and then transmitting the volume setup value and the audio signal to the power amplifier; the DC integrating circuit for receiving the PWM signal from the micro controller unit and integrating the PWM signal into an DC voltage, and then transmitting the DC voltage to a power supply;
   the power supply for receiving the DC voltage from the DC integrating circuit to transmitting a power control signal to a power amplifier to increase or decrease the output voltage thereof;
   the power amplifier for receiving the power control signal from the power supply and the audio signal from the volume controlling circuit, and then amplifying the audio signal according to the power control signal to drive a speaker to output a sound.

2. The power-saving amplifying device as claimed in claim 1, wherein the DC integrating circuit outputs the DC voltage having a value determined by an pulse width of the PWM signal outputted by the micro controller unit.

3. The power-saving amplifying device as claimed in claim 2, wherein the pulse width of the PWM signal is determined by the volume.

4. The power-saving amplifying device as claimed in claim 1, wherein the volume controller is a key pad.

5. power-saving amplifying device as claimed in claim 1, wherein the volume controller is a remote control.

6. The power-saving amplifying device as claimed in claim 1, wherein the power supply comprises a power supply circuit and a PWM controlling circuit, the PWM controlling circuit controls an output voltage of the power supply circuit; the PWM controlling circuit receives the PWM signal from the DC integrating circuit to adjust the output voltage of the power supply circuit according to the PWM signal.

* * * * *